United States Patent
Kondo

(10) Patent No.: US 7,426,017 B2
(45) Date of Patent: Sep. 16, 2008

(54) FOCUS TEST MASK, FOCUS MEASUREMENT METHOD AND EXPOSURE APPARATUS

(75) Inventor: Shinjiro Kondo, Kounosu (JP)

(73) Assignee: Nikon Corporation, Tokyo (JP)

( * ) Notice: Subject to any disclaimer, the term of this patent is extended or adjusted under 35 U.S.C. 154(b) by 78 days.

(21) Appl. No.: 11/319,051

(22) Filed: Dec. 28, 2005

(65) Prior Publication Data

US 2006/0103825 A1  May 18, 2006

Related U.S. Application Data

(63) Continuation of application No. PCT/JP2004/009683, filed on Jul. 1, 2004.

(30) Foreign Application Priority Data

Jul. 3, 2003  (JP) .............................. 2003-190791

(51) Int. Cl.
G03B 27/52 (2006.01)
G03B 27/42 (2006.01)
G03C 5/00 (2006.01)

(52) U.S. Cl. .............................. 355/55; 355/53; 430/30

(58) Field of Classification Search .................. 355/55, 355/52, 53, 30; 430/30; 356/399, 400, 401
See application file for complete search history.

(56) References Cited

U.S. PATENT DOCUMENTS

| 5,300,786 | A | 4/1994 | Brunner et al. |
| 5,948,571 | A | 9/1999 | Mih et al. |
| 6,535,280 | B1 | 3/2003 | La Fontaine et al. |
| 6,674,511 | B2 | 1/2004 | Nomura et al. |
| 6,710,853 | B1 | 3/2004 | La Fontaine et al. |
| 6,811,939 | B2 | 11/2004 | Nakao et al. |
| 6,940,585 | B2 | 9/2005 | Nomura et al. |
| 2002/0021434 | A1 | 2/2002 | Nomura et al. |
| 2002/0041377 | A1 | 4/2002 | Hagiwara et al. |
| 2003/0031943 | A1 | 2/2003 | Nakao et al. |

FOREIGN PATENT DOCUMENTS

| EP | 0 595 196 A1 | 5/1994 |
| JP | A 06-204305 | 7/1994 |
| JP | A 08-304999 | 11/1996 |
| JP | A 09-329888 | 12/1997 |
| JP | A 10-112428 | 4/1998 |
| JP | A 2001-272310 | 10/2001 |
| JP | B2 3297423 | 4/2002 |
| JP | A 2002-198303 | 7/2002 |
| JP | A 2003-57800 | 2/2003 |

Primary Examiner—Peter B Kim
(74) Attorney, Agent, or Firm—Oliff & Berridge, PLC

(57) ABSTRACT

This focus test mask is provided with a test pattern that is projected onto a wafer via a projection optical system. This test pattern includes: a plurality of line patterns that are lined up in a direction of measurement; phase shift sections that are provided in areas adjacent to each of the plurality of line patterns and that are used to shift the phase of light passing through; and reference patterns that are used to obtain an image that forms a reference when the shift in the line pattern image is measured. Spaces between the plurality of line patterns are set at a size that allows each line pattern to be regarded as equivalent to being isolated lines.

29 Claims, 7 Drawing Sheets

US 7,426,017 B2

FOCUS TEST MASK, FOCUS MEASUREMENT METHOD AND EXPOSURE APPARATUS

CROSS-REFERENCE TO RELATED APPLICATION

This is a Continuation Application of International Application No. PCT/JP2004/009683, filed Jul. 1, 2004, which claims priority to Japanese Patent Application No. 2003-190791, filed Jul. 3, 2003. The contents of the aforementioned applications are incorporated herein by reference.

BACKGROUND OF THE INVENTION

1. Field of the Invention

The present invention relates to an exposure mask that is used in the field of semiconductors, a focus measurement method, and an exposure apparatus.

2. Description of Related Art

Conventionally, a test pattern that is provided on a test reticule is formed on a substrate via a projection optical system, and the optical characteristics of this projection optical system are measured by measuring these formed marks. In recent years, a greater degree of focusing accuracy has been demanded, and a more accurate measurement method is also demanded for the focus positions of projection optical systems.

The technologies that are described in the two publications U.S. Pat. No. 5,300,786 and Japanese Patent No. 3297423 are known as conventional focus measurement methods and focus test patterns.

The focus measurement method described in U.S. Pat. No. 5,300,786 uses what are known as levenson type phase shift masks, and uses a phenomenon in which by exposing an isolated line pattern in a defocused state an image of this isolated line pattern is moved in a lateral direction (i.e., in a direction that is perpendicular to the optical axis of the projection optical system).

FIG. 7 shows an example of a focus measurement pattern that is used when a focus position is measured using this measurement method. When this pattern is exposed, typically a box-in-box mark type of pattern is formed. When this pattern is exposed in the defocused state, then the position of the rectangular pattern (i.e., the box pattern) on the inner side and the position of the rectangular pattern (i.e., the box pattern) on the outer side are moved in opposite directions. By measuring the relative positional relationships of these box patterns, it is possible to measure the amount of defocus at the time of exposure.

However, in the measuring of this box pattern, there are only two patterns being measured in each of two orthogonal directions, and it is recognized that when the measurement is made using image pickup elements of an alignment system arranged inside the exposure apparatus then there is a low level of measurement accuracy. In order to resolve this, the number of measurement patterns is being increased. Specifically, measurement marks are not formed by edges as is the case with box-in-box marks, but by bar-in-bar marks that are made up of a plurality of parallel lines. As a result, it becomes possible to measure a measurement pattern having twice the number of lines as the box-in-box marks.

However, in this measurement method, exposure is actually performed twice, and the measurement pattern is formed by cutting out a portion of a number of diffraction grating patterns. Because of this, this measurement method has the drawback that if there is a large amount of defocus and the position movement exceeds half the pitch between diffraction gratings, then measurement is not possible.

The focus measurement method described in Japanese Patent No. 3297423 makes use of the following phenomenon. Namely, the diffraction efficiencies of positive primary light and negative primary light in a diffraction grating pattern are differentiated from each other (ideally one is set to zero) so that an asymmetrical diffraction grating pattern is formed, and when this asymmetrical diffraction grating pattern is exposed in a defocused state, an image of the asymmetrical diffraction grating pattern moves in a lateral direction.

An example is shown in FIG. 8A of a focus measurement pattern that is used when a focus position is measured in this measurement method. When the reference patterns are the large isolated patterns 21a and 21b, then when an asymmetrical diffraction grating pattern 10 is exposed in a defocused state, the position of the image of the asymmetrical diffraction grating 10 moves, for example, in the direction indicated by the arrow relative to the positions of the images of the isolated patterns 21a and 21b. Moreover, as is shown in FIG. 8B, the reference patterns may be diffraction grating patterns (i.e., 22a and 22b), or, as is shown in FIG. 8C, the reference patterns may be asymmetrical diffraction grating patterns (i.e., 23a and 23b).

However, in these asymmetrical diffraction grating patterns, because one of either positive primary diffracted light and negative primary diffracted light is set to substantially zero, there is a possibility that the exposure amount will be insufficient when the pattern is exposed on a substrate. For example, in the case of a scanning exposure apparatus that performs exposure by relatively scanning a mask and a substrate, the scanning speed must be slowed down and conditions different from normal circuit pattern exposure conditions are used. As a result, there is a possibility that results will be created that are different from the situation at the time of the actual exposure.

The present invention was conceived in view of the above described circumstances, and it is an object thereof to provide a focus test mask that enables a pattern to be exposed in the same conditions as the actual exposure conditions, and that has a test pattern capable of being measured by an image pickup element that is provided inside the exposure apparatus, and to provide a measurement method and exposure apparatus that use this focus test mask.

SUMMARY OF THE INVENTION

In order to solve the above described problems, the present invention provides a focus test mask that is provided with a test pattern that is projected onto a substrate via a projection optical system, wherein the test pattern includes: a plurality of line patterns that are lined up in a direction of measurement; phase shift sections that are provided in an area adjacent to each of the plurality of line patterns and that are used to shift the phase of light passing through; and reference patterns that are used to obtain an image that forms a reference when the shift in the line pattern image is measured, and wherein spaces between the plurality of line patterns are set at a size that allows each line pattern to be regarded as equivalent to being isolated lines.

According to the present invention, it is possible to form a plurality of line patterns as respective isolated lines, and, by detecting the positions of the images of the plurality of line patterns, it is possible to measure any shift between these positions and the position of an image of a reference pattern with a high degree of accuracy.

It is also possible for the plurality of line patterns to be placed at a plurality of different spaces, or for the plurality of line patterns to all be placed at an equal space.

Moreover, it is also possible for the plurality of line patterns to be formed by a plurality of pairs of line patterns, which are formed by two line patterns positioned apart at a space d2, and which are positioned apart at a space d3 that is larger than the space d2.

It is also desirable for the space between the line patterns to be set to be 10 times or more larger than the width of the line patterns.

Moreover, it is desirable for the space between the line patterns to be large enough to allow secondary or greater diffracted light from the line patterns to also be used for focusing via the projection optical system.

In addition, the focus test mask of the present invention may be provided with a plurality of types of test patterns, and it is desirable that line widths of the line patterns forming the test patterns be different for each type of test pattern. By employing this mode, it is possible to select a line pattern having the optimum width in accordance with the conditions (for example, the NA of the projection optical system) of the exposure apparatus being used.

The present invention provides a focus test mask that is provided with a test pattern that is projected onto a substrate via a projection optical system, wherein the test pattern comprises: a plurality of line patterns that are lined up in a direction of measurement; first phase shift sections that are provided in the vicinity of one side of the line pattern along the line pattern and that are used to shift the phase of light passing through; and a plurality of reference patterns that are lined up in the direction of measurement and that are used to obtain an image that forms a reference when the shift in the line pattern image is measured, and wherein spaces between the plurality of line patterns are set at a size that allows each line pattern to be regarded as equivalent to being isolated lines, and spaces between the plurality of reference patterns are set at a size that allows each reference pattern to be regarded as equivalent to being isolated lines.

In the focus test mask of the present invention, it is desirable that the test pattern further comprises second phase shift sections that are provided in the vicinity of one side of the reference pattern along the reference pattern and that are used to shift the phase of light passing through, and wherein a position of the first phase shift sections relative to the line patterns is reverse to a position of the second phase shift sections relative to the reference patterns.

It is desirable that the plurality of the reference patterns are disposed on both sides of the plurality of the line patterns in the direction of measurement of the plurality of line patterns.

It is desirable that the plurality of line patterns are formed by a plurality of pairs of line patterns, which are formed by two line patterns positioned apart at a space d2 that is set at a size that allows each line pattern to be regarded as equivalent to being isolated lines, and which are positioned apart at a space d3 that is larger than the space d2, and wherein the plurality of reference patterns are formed by a plurality of pairs of reference patterns, which are formed by two reference patterns positioned apart at the space d2, and which are positioned apart at the space d3.

It is desirable that the plurality of the reference patterns are disposed on both sides of the plurality of the line patterns in the direction of measurement of the plurality of line patterns.

It is desirable that the space between the line patterns is set to be 10 times or more larger than the width of the line patterns.

It is desirable that the space d3 is set to be 2 times or more larger than the space d2.

Furthermore, the present invention provides a focus measurement method in which a pattern on a focus test mask is projected via a projection optical system of an exposure apparatus, and a focus position of the projection optical system is measured by measuring a shift in the projected image, that includes: preparing a focus test mask having the above described features is prepared as the focus test mask; and measuring a relative distance between an image of the projected line pattern and an image of the reference patterns is measured.

In the focus measurement method of the present invention, it is desirable that the method further include exposing a projected image of the focus test mask pattern is exposed onto a substrate prior to the measuring step, and that a relative distance between an image of the line pattern that is formed on the substrate and an image of the reference patterns is measured, in the measuring step.

At this time, it is desirable that the image of the line pattern that is formed on the substrate be picked up using an image pickup element that is provided inside the exposure apparatus, and then the image is processed, in the measuring step.

The present invention provides a focus measurement method in which reference patterns that are formed on a mask and line patterns that are formed on the mask and that are provided in the vicinity of phase shift sections that are used to shift the phase of light passing through the mask are projected via a projection optical system of an exposure apparatus, and a focus position of the projection optical system is measured by measuring a relative shift between an image of the line patterns and an image of the reference patterns, comprising: detecting each position of the images of the line patterns that are formed so as to regard each line pattern as equivalent to being isolated lines and that shift in the same direction with respect to the images of the reference patterns; calculating the position of a set of the images of the line patterns based on a result of the detecting of each position of the images of the line patterns; detecting each position of the images of the reference patterns that are formed so as to regard each reference patterns as equivalent to being isolated lines; calculating the position of a set of the images of the reference patterns based on a result of the detecting of each position of the images of the reference patterns; calculating the relative shift based on the position of the set of the images of the line patterns and the position of the set of the images of the reference patterns; and calculating the focus position.

It is desirable that each space between the plurality of the line patterns is set to be 10 times or more larger than the width of the line patterns.

It is desirable that the images of the line patterns and the images of the reference patterns are formed on a substrate by projection exposure using the projection optical system.

It is desirable that the step of calculating the position of the images of the line patterns and the position of the images of the reference patterns, comprises: capturing the images that are formed on the substrate; detecting the position of the images by processing captured signals that are obtained by capturing the images at every image of the line patterns and the reference patterns; and calculating the position of the set of the images of the line patterns and the position of the set of the images of the reference patterns based on each position of the images.

Moreover, the present invention provides an exposure apparatus that projects a pattern provided on a focus test mask via a projection optical system, and measures a focus position of the projection optical system by measuring a shift in the projected image, that includes: a measuring device that detects an image of a focus test mask having the above described features that is projected via the projection optical system, and measures a relative distance between the image of the line pattern and the image of the reference patterns.

Note that it is also possible for the focus test mask to be a reference plate that is provided at a different position from a holding section that holds the mask on a mask stage that holds a mask on which a circuit pattern is formed.

In addition, it is desirable that the measuring device detect an image of the pattern that is projected onto the substrate via the projection optical system and is formed on the substrate.

It is also desirable that the measuring device detect a spatial image of the pattern that has been projected via the projection optical system.

According to the present invention, it is possible to provide a focus test mask that enables a pattern to be exposed under the same conditions as the actual exposure conditions and that has a test pattern that can be measured by an alignment microscope that is provided inside the exposure apparatus, and to provide a measurement method and an exposure apparatus that use this focus test mask.

BRIEF DESCRIPTION OF THE DRAWINGS

FIG. 4A is a plan view showing another embodiment of the focus test pattern of the present invention, while

DESCRIPTION OF THE PREFERRED EMBODIMENTS

An embodiment obtained by embodying the present invention in a scan exposure type of exposure apparatus that is used in the manufacture of semiconductor devices will now be described based on FIGS. 1 through 6.

Figure 1:
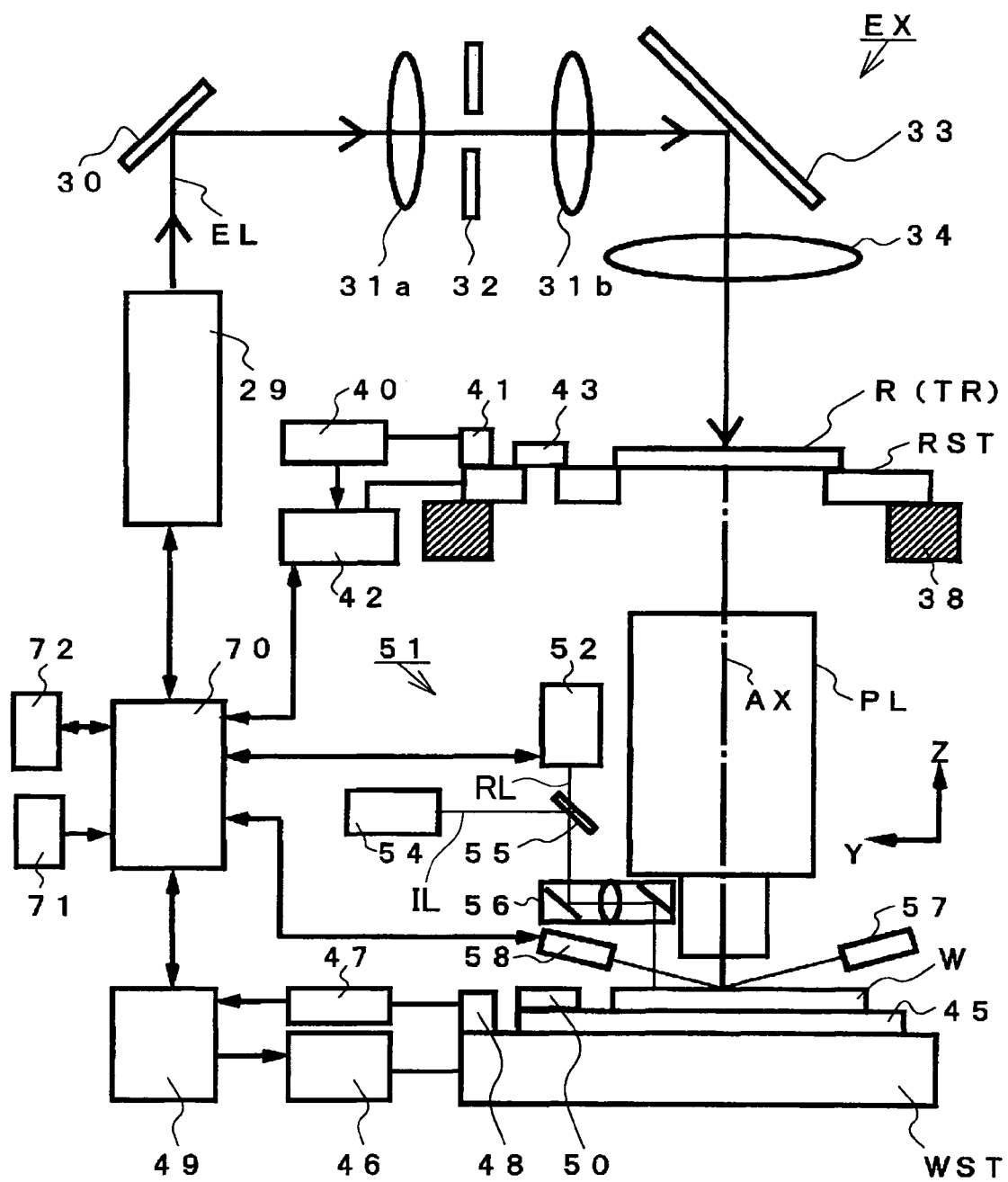
FIG. 1 is a plan view showing a schematic structural view of an exposure apparatus in an embodiment of the present invention.

As is shown in FIG. 1, an exposure apparatus EX of the present embodiment transfers by projection a circuit pattern that is formed on a reticule R serving as a mask onto a wafer W serving as a substrate. Exposure light EL that is irradiated from an illumination optical system 29 that includes an exposure light source, a collimator lens, an interference filter, a fly-eye lens, an aperture diaphragm (i.e., a σ diaphragm) and the like is reflected by a beam splitter 30. The exposure light EL may be, for example, excimer laser light such as KrF, ArF, or F2, higher harmonics such as a metal vapor laser or a YAG laser, or bright lines from an extra-high pressure mercury lamp such as g-lines, h-lines, and i-lines. The exposure light EL that is reflected by the beam splitter 30 is irradiated via relay lenses 31a and 31b, a reticule blind 32, a mirror 33, and a condenser lens 34 onto a reticule R on which a circuit pattern of a semiconductor device or the like has been formed (or a focus test reticule TR on which a focus test pattern has been formed), so that the illumination area of the reticule R is illuminated at a uniform illumination intensity.

The reticule R is vacuum suctioned on a reticule stage RST serving as a mask stage that is provided on a base 38. This reticule stage RST is held such that it can be moved minute distances in two-dimensional directions on the base 38 via air bearings or the like in order for the reticule R to be positioned within a plane that intersects the optical axis of the exposure light EL.

A movable mirror 41 that reflects laser beams from an interferometer is fixed to an end portion of the reticule stage RST. The position in the scan direction of the reticule stage RST is constantly detected by the interferometer 40 at a resolution of, for example, approximately 0.01 μm, and position information from this is sent to a reticule stage control unit 42. The reticule stage control unit 42 controls a reticule stage drive section (not shown) based on the position information about the reticule stage RST and moves the reticule stage RST.

A reference plate 43 on which is provided a test pattern that is used to measure imaging characteristics of a projection optical system PL is provided on the reticule stage RST. The surface of this reference plate 43 on which the pattern is formed is provided so as to be at substantially the same height as the surface of the reticule R on which the pattern is formed.

Exposure light EL that has passed through the reticule R is irradiated into, for example, a two-sided telecentric projection optical system PL. In the projection optical system PL, a projection image that is obtained by shrinking the circuit pattern formed on the reticule R of this projection optical system PL to, for example, ⅕ or ¼ size is formed on a wafer W on a surface of which has been coated a photoresist that has photosensitivity towards the exposure light EL.

Then, the illumination area of the reticule R is adjusted to a rectangular (i.e., slit) shape by the reticule blind 32. By scanning the reticule R in a +Y direction during exposure at a scan speed of Vr, the circuit pattern on the reticule R is sequentially illuminated in a slit-shaped illumination area from one end thereof towards the other end thereof. Because the wafer W is in an inverted positional relationship relative to the reticule R, the wafer W is scanned at a scan speed of Vw in synchronization with the scanning of the reticule R in the opposite direction to the reticule R (i.e., in a −Y direction). As a result, it is possible to expose the entire shot area of the wafer W. A scan speed ratio Vw/Vr corresponds to the reduction factor of the projection optical system PL and the circuit pattern on the reticule R is accurately transferred at a reduced magnification onto each shot area on the wafer W.

The wafer W is vacuum suctioned onto a wafer holder 45 and is held via the wafer holder 45 on a wafer stage WST serving as a substrate stage. The wafer holder 45 is able to be tilted in an optional direction relative to the most suitable imaging surface of the projection optical system PL by a drive section (not shown), and is also able to be moved in minute distances in an optical axis AX direction (i.e., a Z direction) of the projection optical system PL. Moreover, the wafer stage WST is formed so as to be able to be moved by a wafer stage drive section 46, which is formed by a motor or the like, not only in the scan direction (i.e., a Y direction), but also in a direction perpendicular to the scan direction (i.e., an X direction) so as to be able to move optionally to a plurality of shot areas. As a result, a step and scan operation in which an operation to scan expose each shot area on the wafer W and an operation to move to the start position of the next scan exposure are repeated, is possible.

A movable mirror 48 that reflects a laser beam from the interferometer 47 is fixed to an end portion of the wafer stage WST. The positions in the XY directions of the wafer stage WST are constantly detected at a resolution of, for example, approximately 0.01 µm by the interferometer 47. The position information (or speed information) about the wafer stage WST is sent to a wafer stage control unit 49, and the wafer stage control unit 49 controls a wafer stage drive section 46 based on this position information (or speed information).

In addition, a reference plate 50 that is provided with reference marks that are used for detecting reference positions for transfer exposures, in this case, the relative position of the reticle R relative to the center of an exposure field of the projection optical system PL is provided on the wafer stage WST. The reference plate 50 is provided so as to be at substantially the same height as the surface of the wafer W.

A focal point detection system (57 and 58) that is formed by a light projecting system 57 and a light receiving system 58 and that provides position (i.e., the position in the optical axis AX direction of the projection optical system PL) information on the height of the wafer W is provided on both sides adjacent to the projection optical system PL. Measurement beams from the light projecting system 57 are irradiated onto the wafer W, and the measurement beams that are reflected by the wafer W are received by a photoelectric detector housed inside the light receiving system 58. The light receiving system 58 detects information on the height position of the wafer W based on detection signals from the photoelectric detector, and supplies this to a main control system 70. The main control system 70 adjusts the height position and tilt of the wafer stage WST based on this height position information, and makes the surface of the wafer W match the imaging surface of the projection optical system. In addition, the main control system is able to supply the focal point detection system (57 and 58) with predetermined offset amounts.

A photoelectric detector 51 that is used for detecting the image formation state of a pattern image projected on the wafer W and also WA reference marks on the reference plate 50 is provided at a side of the projection optical system PL. This photoelectric detector 51 forms a measuring device that measures information relating to distortion and also forms a photoelectric detecting device, and is an image pickup type of device that makes a detection by picking up an image of the pattern on the wafer W and an image of reference marks on the reference plate 50 using an image pickup element 52.

This photoelectric detector 51 has an illumination optical system 54 that includes a halogen lamp, a condenser lens, optical fiber, interference filters, a lens system and the like. Light in the infrared wavelength regions and photosensitive wavelength regions of the photoresist layer out of the wideband illumination light IL that is irradiated from the halogen lamp is cut by the interference filters. In addition, illumination light IL that is irradiated from the illumination optical system 54 is irradiated into an objective optical system 56 that is formed by a beam splitter 55, mirrors, a prism, and an objective lens. The illumination light IL that is emitted from the objective optical system 56 is irradiated substantially perpendicularly onto the wafer W such that the illumination visual field of the projection optical system PL is not obstructed.

A projection area on the wafer W is illuminated by this irradiation and reflected light RL that is reflected from the relevant area in accordance with this illumination is guided to the image pickup element 52 via the objective optical system 56 and the beam splitter 55. A transparent window and lens system (not shown) are provided within the image pickup element 52, and the reflected light RL forms an image inside the transparent window. This formed image is then projected via the lens system and is then photoelectrically converted into image pickup signals. The image pickup signals are then supplied to the main control system 70, and waveform processing is performed on the image pickup signals. As a result, the position information of the pattern image provided on the wafer W is calculated. Note that this photoelectric detector 51 is also used to measure alignment marks provided on the wafer W, and to measure a test pattern image when a test pattern provided on the test reticule R is exposed onto the wafer W.

An input device 71 such as a keyboard or bar code reader is also connected to the main control system 70. Information relating to the size of the wafer W, the projection magnification factor, the value of the aperture of the reticle blind 32 (i.e., the width of the illumination slit), the target exposure amount, the scan speed, and the reference pattern image (i.e., a normal pattern image without any distortion), as well as various types of information such as the conditions of the measurement by the photoelectric detector 51 are able to be input via this input device 71 into the main control system 70.

A hard disk section 72 that serves as a storage device and parameter calculation device is also connected to the main control system 70. Based on information relating to any movement in the position of the test pattern image calculated by the photoelectric detector 51, the main control system 70 obtains information relating to the optimum imaging surface (i.e., the best focusing surface) of the projection optical system, and stores this in the hard disk section 72 so that it corresponds with a position on the substrate. In addition, information relating to the position of the best focusing surface calculated in this manner is stored in a reference data file that is separated into each shot area inside the hard disk section 72.

Next, a description will be given based on FIGS. 2 to 4 of the focus test mask of the present embodiment and a measuring method that uses this focus test mask.

Figure 2:
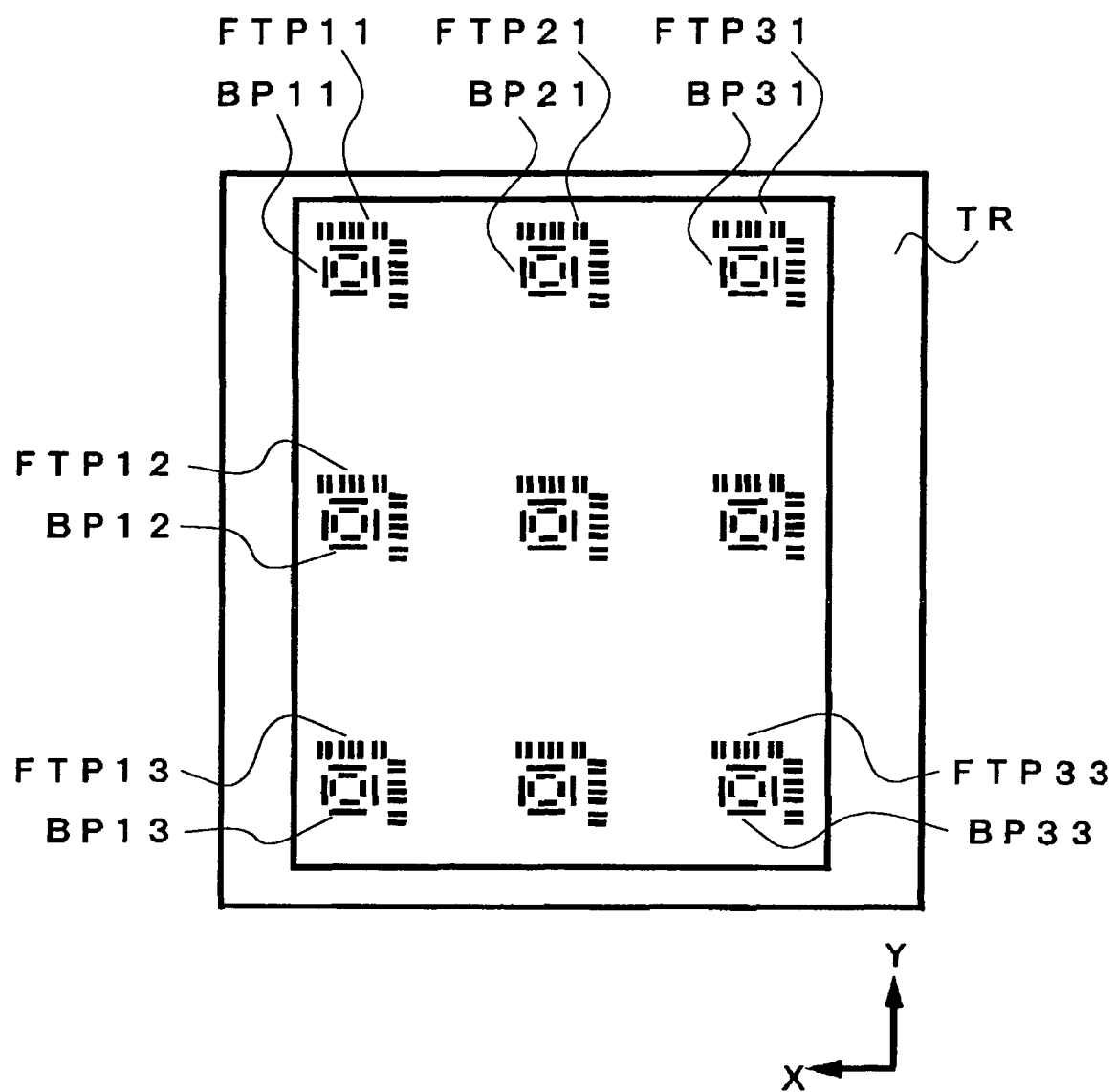
FIG. 2 is a plan view of a test reticule in an embodiment of the present invention.

FIG. 2 shows the focus test reticle TR of the present invention. Three rows by three columns of focus test patterns FTP11, FTP12, FTP13, FTP21, FTP22, FTP23, FTP31, FTP32, and FTP33 are provided inside a pattern area of the focus test reticle TR. The respective focus test patterns FTP11 to FTP33 are formed by patterns that extend in an X direction and patterns that extend in a Y direction. For example, the pattern that extends in the X direction of the focus test pattern FTP11 is shown in FIG. 3A while a cross-sectional view thereof is shown in FIG. 3B.

Figure 3A:
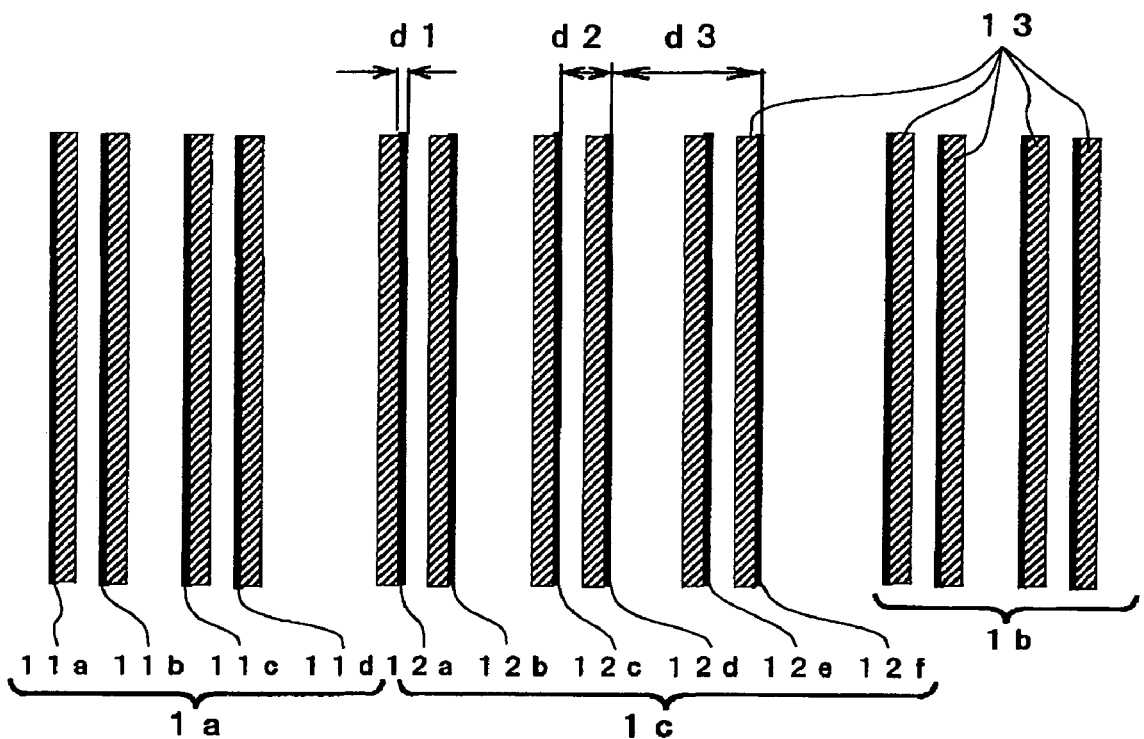
FIG. 3A is a plan view showing an embodiment of the focus test pattern of the present invention.
Figure 3B:
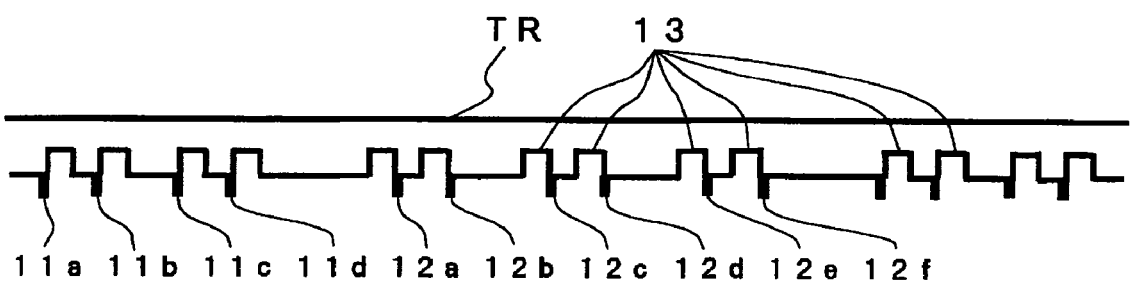
FIG. 3B is a cross-sectional view of the pattern shown in FIG. 3A.

As is shown in FIG. 3A, main scales 1a and 1b are provided at the two ends of the focus test pattern FTP 11 while a sub scale 1c is provided between 1a and 1b. The main scale 1a that is on the left side in FIG. 3A is provided with four parallel line patterns 11a, 11b, 11c, and 11d. The patterns 11a and 11b form one pair while the patterns 11c and 11d form another pair. The space d2 between line patterns in each pair and the space d3 between each pair are different values. Because the main scale 1b that is on the right side has the same structure, a description thereof is omitted here.

The sub scale 1c is provided with six parallel line patterns 12a, 12b, 12c, 12d, 12e, and 12f. The patterns 12a and 12b form a first pair, the patterns 12c and 12d form a second pair, and the patterns 12e and 12f form a third pair. The space d2 between line patterns in each pair and the space d3 between each pair are different values.

Next, a description will be given of the specific dimensions. Each of the line patterns 11a to 11d and 12a to 12f have the same width d1, and d1=0.1 μm (micrometers). The pattern space d2 of each pair is approximately 5 μm (micrometers), and the space d3 between each pair is approximately 12 μm (micrometers). In this manner, compared to the pattern line width, the spaces between patterns and between pairs is extremely large, and each respective line pattern is substantially equivalent to being an isolated pattern. In order to make each line pattern substantially equivalent to an independent pattern, for example, the space in each pattern may be made 10 times or more larger than the pattern line width d1. As a result of this, each line pattern forms a single independent pattern and the secondary and greater diffracted light of each line pattern is also focused as a line pattern image via the projection optical system PL.

Note that, in the present embodiment, the reason why the main scales 1a and 1b and the sub scale 1c are formed with the same line width d1 is because, by forming them in this way, it is possible to measure defocus amounts with greater sensitivity. However, it is also possible for the line width of the line patterns forming the main scales 1a and 1b to be made different from the line width of the line patterns forming the sub scale 1c.

In FIGS. 3A and 3B, phase shift sections 13 are provided at the right side of each of the line patterns of the main scales 1a and 1b. These phase shift sections 13 are formed so as to shift the phase of light passing therethrough by 90°. In the same way, phase shift sections 13 that shift the phase of light passing therethrough by 90° are provided at the left side of the line patterns of the sub scales 1c. In this way, because the positions of the phase shift sections 13 provided for the main scales 1a and 1b and the sub scale 1c are reversed, when the focus test patterns FTP11 to FTP33 are exposed in a defocused state, the directions in which the positions shift are opposite directions from each other.

Figure 3C:
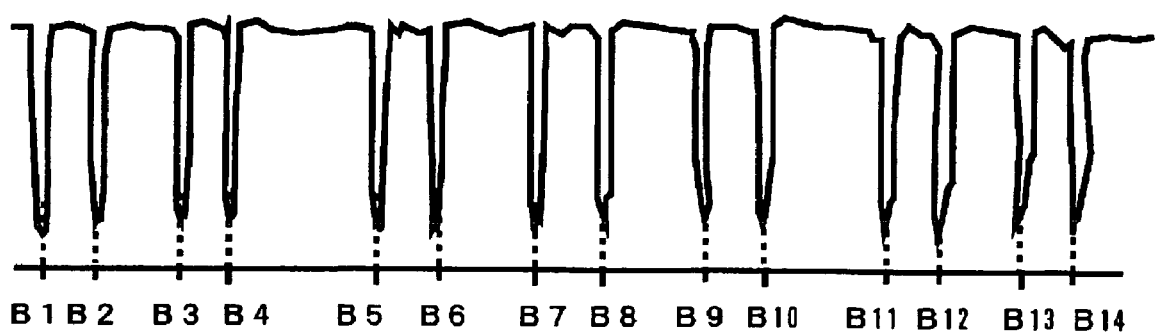
FIG. 3C is a view showing a detection signal when the pattern shown in FIG. 3A is detected using a photoelectric detector.

An image that has been formed by exposing this focus test pattern FTP11 onto a wafer W is detected by the photoelectric detector 51 inside the exposure apparatus shown in FIG. 1. The detected signal at this time is shown in FIG. 3C. FIG. 3C shows the distribution of the signal intensity when an image of a focus test pattern that has been picked up by the image pickup element 52 of the photoelectric detector 51 is scanned using predetermined scan lines. As can be understood from FIG. 3C, the intensity of the detected signal is low in the portions of each line pattern. In this example, because there are a total of eight line patterns in the main scales and a total of six line patterns in the sub scale, by detecting the positions of bottom portions B1 to B14 of these, it is possible to accurately detect the relative positional relationship between the main scales and the sub scale using an average effect. Based on the information on the position shift between the main scales 1a and 1b and the sub scale 1c, the main control system 70 calculates how far from the best focus position was the position where the focus test pattern was exposed, namely, calculates where the best focus position is.

Returning to FIG. 2, Box patterns BP11, BP12, BP13, BP21, BP22, BP23, BP31, BP32, and BP33 are provided on the focus test reticule TR adjacent to each of the focus test patterns FTP11 to FTP33. In the same way as the above described focus test patterns FTP11 to FTP33, the box patterns also are used for measuring the best focus position of a projection optical system. The box pattern BP11 is shown in FIG. 4A and a cross-sectional view thereof is shown in FIG. 4B.

Figure 4A:
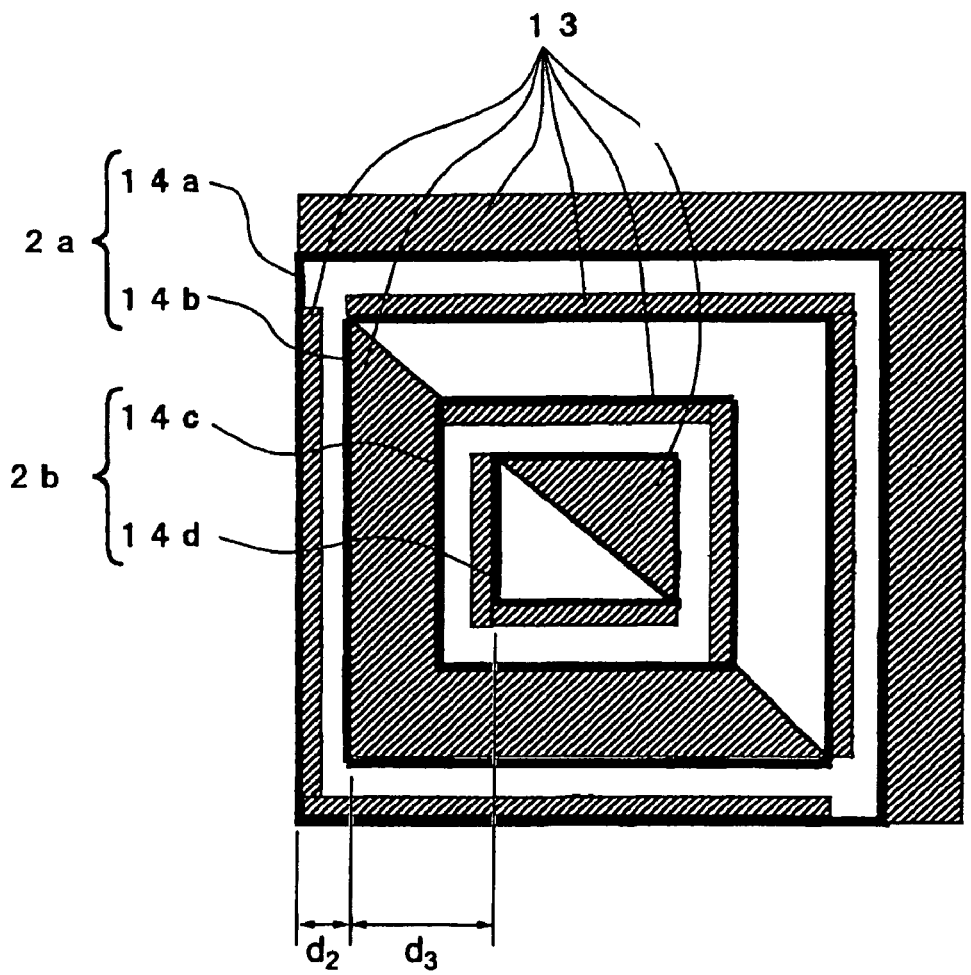
Figure 4B:
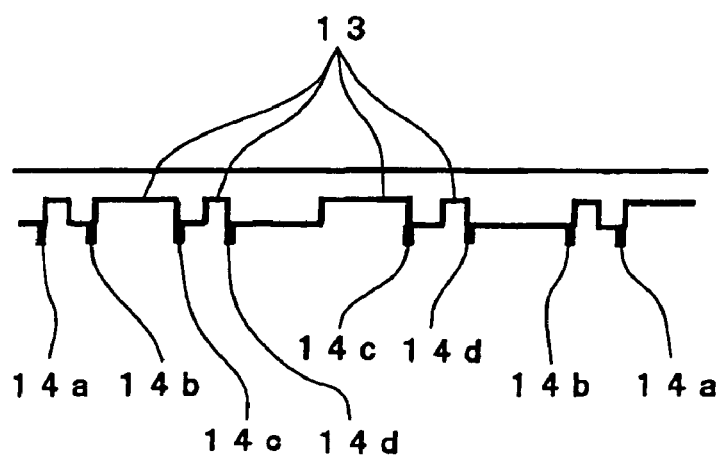
FIG. 4B is a cross-sectional view of the pattern shown in FIG. 4A.

As is shown in FIGS. 4A and 4B, an outer side box pattern 2a and an inner side box pattern 2b are each formed by two line patterns, namely, 14a, 14b, 14c, and 14d. A space d2 between the line patterns of each pair and a space d3 between each pair are the same values as in the above described FIG. 3A. Moreover, a phase shift section 13 is provided at the right side of each line pattern 14a and 14b in the outer side box pattern 2a, while a phase shift section 13 is provided at the left side of each line pattern 14c and 14d in the inner side box pattern 2b.

In this type of box pattern as well, when a pattern is exposed in a defocused state, because the direction in which the position of the outer side box pattern 2a moves and the direction in which the position of the inner side box pattern 2b moves are opposite directions, by detecting the relative positional relationship between these box patterns using the photoelectric detector 51, it is possible to measure the best focus position of the projection optical system PL.

Note that, in FIGS. 2 through 4, only one type of line width is disclosed for the line patterns, however, it is desirable that patterns having a plurality of line widths each be prepared. Namely, a plurality of types of focus test patterns each having a different line width for their line pattern are provided on the focus test reticule TR. Because of this, it is possible, for example, to select a line width for the pattern being measured in accordance with the conditions (for example, the NA value of the projection optical system) of the exposure apparatus measuring the focus, and a line pattern can be used whose line width has the highest sensitivity to a position movement that corresponds to the defocus amount. Note that, it is also possible to alter the line pattern spaces d2 and d3 in accordance with the line width of the line pattern.

Next, a sequence for measuring the best focus position of a projection optical system using this focus test reticule TR will be described.

Firstly, the focus test reticule TR is placed on the reticule stage RST. Next, a test wafer is placed at a predetermined Z position by the focal point detection system 57 and 58, and the focus test patterns FTP11 to FTP33 and the box patterns BT11 to BT33 on the test reticule TR are exposed onto a plurality of shot areas on the test wafer.

Next, this test wafer undergoes developing processing using a coater developer (not shown), and the respective test patterns are formed. Thereafter, the test wafer is once again transported to the exposure apparatus and is placed on the wafer stage WST. The main control system 70 then sequentially picks up for each shot an image of optional test patterns (for example, the focus test patterns FTP11 to FTP33) that have been printed on the entire surface of the test wafer using the image pickup element 52 of the photoelectric detector 51. Position information (i.e., the relative positional relationship between the main scale and sub scale) on the test patterns that have been picked up is then sent to the main control system 70.

The main control system 70 then measures focus offset amounts in the respective positions within the shot areas from the position information on the respective test patterns that have been placed within each shot area. The main control system 70 also detects any measurement in the position of the exposed surface of the wafer W relative to the optimum focusing surface of the projection optical system PL (i.e., the focusing surface shift amount) from the result of the measurement of the focus offset amounts at the respective positions within the shot areas, and stores this on the hard disk 72. In addition, when the actual circuit pattern exposure processing is being performed, the focus offset amounts and the focusing surface shift amount that are stored on the hard disk 72 are read and, using these, the attitude and the position in the Z direction of the wafer W are corrected. As a result, it is possible to place the wafer W in the true best focus position and on the optimum focusing surface.

In addition, the main control system 70 matches the focus offset amounts at the respective positions within the shot areas with the type of focus test pattern that was used to measure each focus offset amount, and stores them in the hard disk 72. In addition, the main control system 70 categorizes the measurement results according to the type of focus test pattern, adds thereto the position within the shot areas of the focus test patterns, and measures the performance of the projection optical system PL. For example, the main control system 70 may categorize the measurement results into two types, namely, measurement results that use a focus test pattern having line patterns that are parallel with the X axial direction and measurement results that use a focus test pattern having line patterns that are parallel with the Y axial direction. Position information within the shot areas is then added to these results and the state of astigmatism within each shot area is detected. Alternatively, the main control system 70 can also detect the shape (i.e., the image surface curvature and the image surface tilt) of the focusing surface of the projection optical system PL from the results of the measurement of the focus offset amounts at the respective positions within each shot area that were stored on the hard disk 72. In this way, the main control unit 70 is able to measure the performance of the exposure apparatus EX and, particularly, the projection optical system PL in cooperation with the focus test reticule TR.

Figure 5:
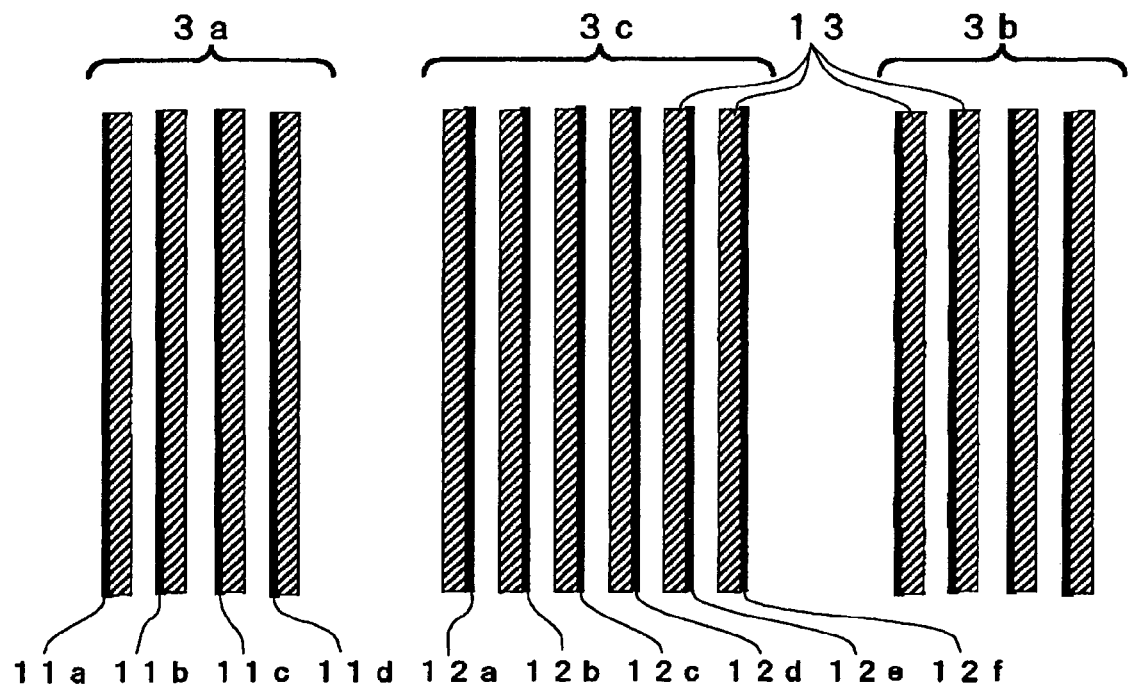
FIG. 5 is a plan view showing another embodiment of the focus test pattern of the present invention.
Figure 6:
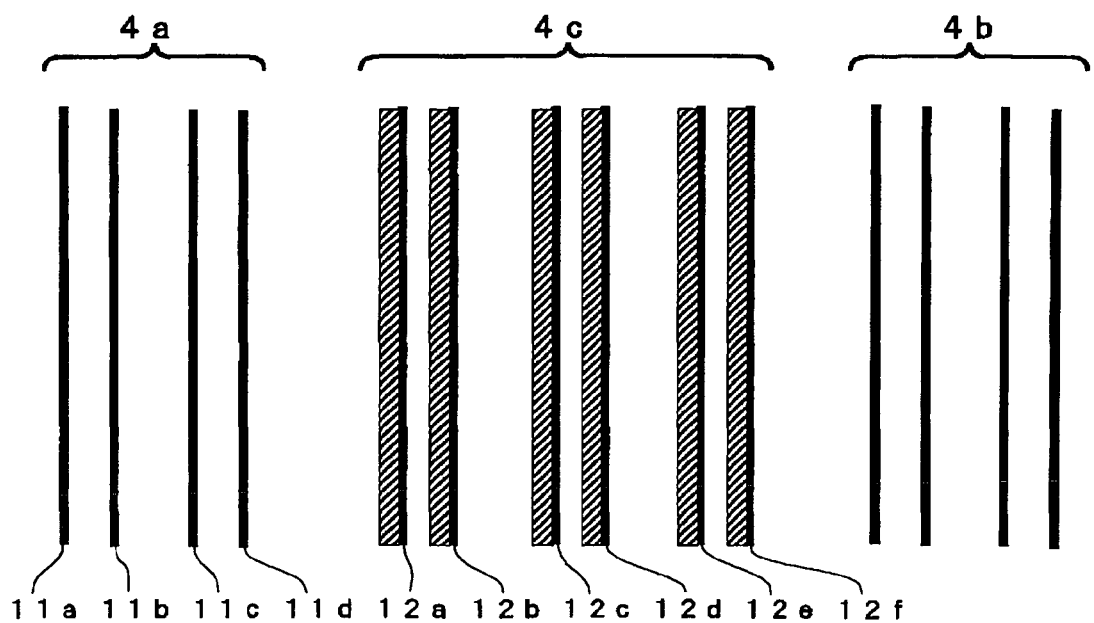
FIG. 6 is a plan view showing another embodiment of the focus test pattern of the present invention.
Figure 7:
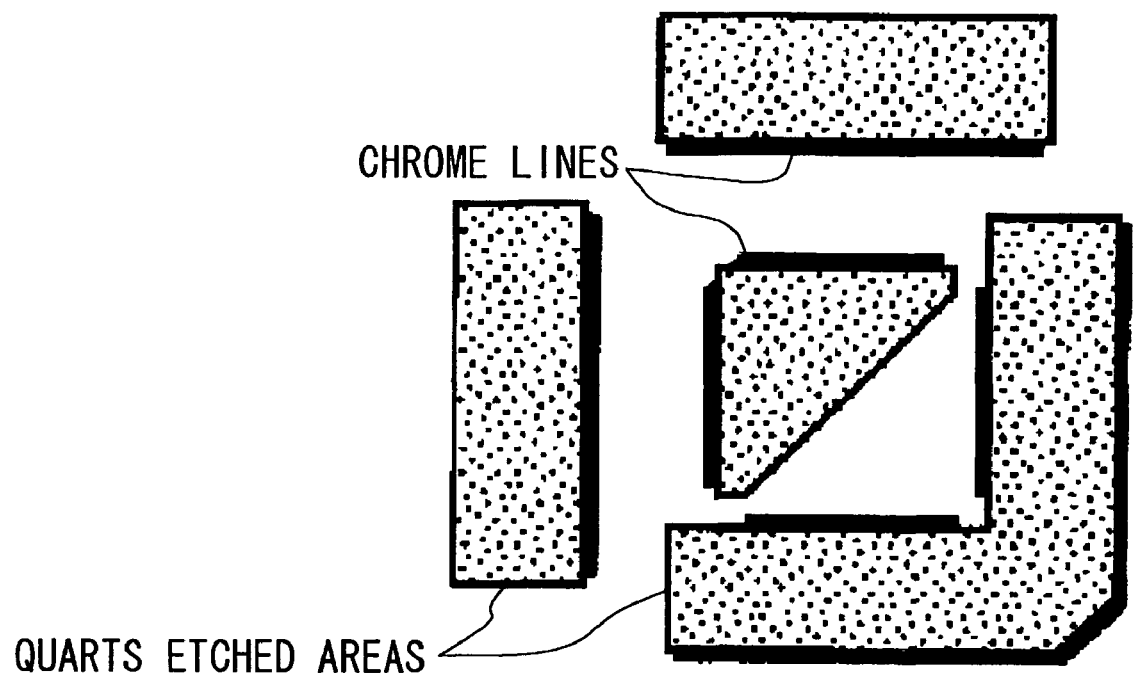
FIG. 7 is a plan view showing an example of a conventional focus test pattern.
Figure 8A:
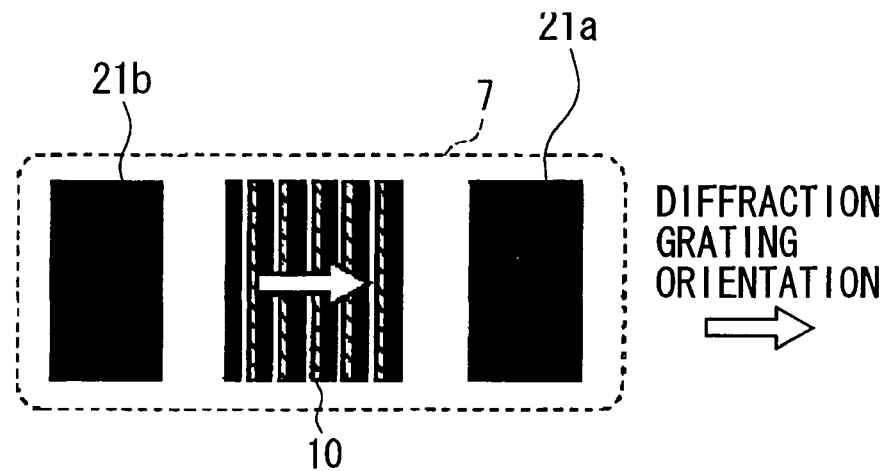
FIG. 8A is a plan view showing an example of a focus test pattern when the reference patterns are large isolated patterns.
Figure 8B:
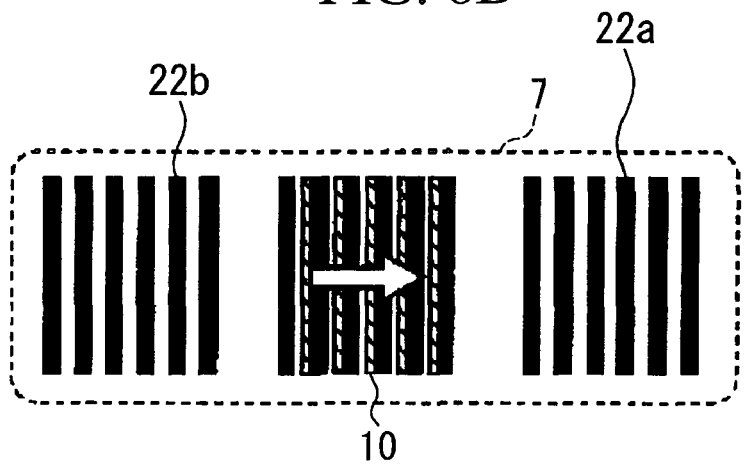
FIG. 8B is a plan view showing an example of a focus test pattern when the reference patterns are diffraction grating patterns.
Figure 8C:
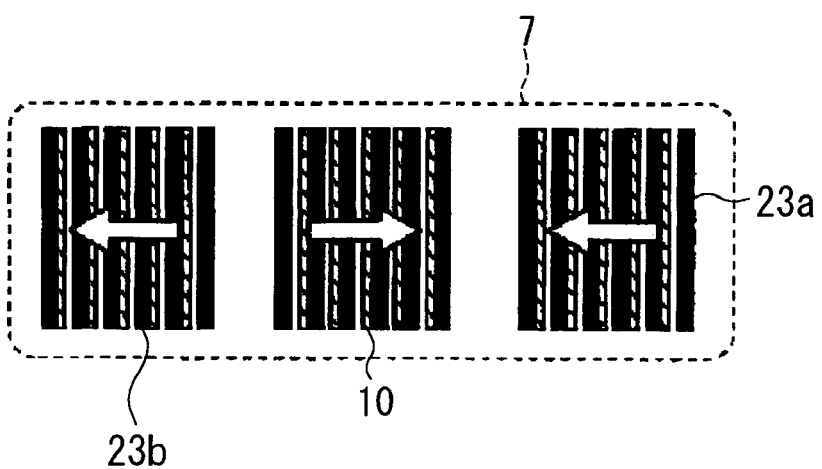
FIG. 8C is a plan view showing an example of a focus test pattern when the reference patterns are asymmetrical diffraction grating patterns.

The focus test pattern of the present embodiment is not limited to those shown in FIGS. 2 through 4, for example, as is shown in FIG. 5, it is also possible for each line pattern of main scales 3a and 3b and a sub scale 3c to all be aligned at the same pitch. In this case as well, it is necessary to provide a sufficient space between each line pattern so that each line pattern is equivalent to an isolated line. Moreover, as is shown in FIG. 6, it is also acceptable if phase shift sections are not formed in the line patterns of main scales 4a and 4b. Note that, in FIGS. 5 and 6, the same symbols are used for the same components as in FIGS. 2 through 4.

Furthermore, in the present embodiment, an example is given in which the focus test patterns FTP11 to FTP33 and the box patterns BP11 to BP33 are provided on the test reticule TR, however, the present invention is not limited to this. For example, it is also possible for these patterns to be provided on the reference plate 43 that is provided on the reticule stage RST shown in FIG. 1. Namely, a structure may also be employed in which a test reticule is provided in advance on a reticule stage. According to this type of structure, the task of switching from the actual reticule on which the circuit pattern is provided to the test reticule is not necessary, and it is possible to check the best focus position using the reference plate 43 at an optional timing, which is advantageous from the viewpoint of throughput.

Furthermore, in the present embodiment, an example is given in which a resist image of the test pattern that has been exposed onto the wafer W is detected by the photodetector 51, and position information about the test pattern is detected, however, the present invention is not limited to this, and it is also possible to use another detection method. For example, it is also possible to determine position information (i.e., relative positional relationships between the main scales and the sub scale) of a test pattern by providing an aerial image measuring apparatus, which is formed by slits through which light passes and by a photoelectric sensor that detects the light passing through the slits, adjacent to the focusing surface of the projection optical system PL, for example, on the wafer stage WS, and by measuring an aerial image of the test pattern using this. According to this structure, when the position of a test pattern is detected, there is no need to expose and develop the wafer W.

While preferred embodiments of the invention have been described and illustrated above, it should be understood that these are exemplary of the invention and are not to be considered as limiting. Additions, omissions, substitutions, and other modifications to the structure, for example, to the dimensions of the pattern line width, the shape, and the placement can be made without departing from the spirit or scope of the present invention. Accordingly, the invention is not to be considered as limited by the foregoing description and is only limited by the scope of the appended claims.

The present invention relates a focus test mask that is provided with a pattern that is projected onto a substrate via a projection optical system. The focus test mask includes a plurality of line patterns that are lined up in the direction of measurement, phase shift sections that are provided in an area adjacent to each of the plurality of line patterns and that are used to shift the phase of light passing through, and reference patterns that are used to obtain an image that forms a reference when the shift in the line pattern image is measured. In this focus test mask, the spaces between the plurality of line patterns are sufficiently greater than the width of the line patterns.

The present invention relates a focus measurement method in which a pattern on a focus test mask is projected onto a substrate via the projection optical system of an exposure apparatus, and an amount of defocus on the substrate is measured by measuring the shift in the projected image. In this method, a focus test mask having the above described features is prepared as the focus test mask, and a relative distance between the image of the line pattern that is formed on the substrate and the image of the reference patterns are measured.

The present invention relates an exposure apparatus that projects a pattern provided on a focus test mask onto a substrate via a projection optical system, and measures an amount of defocus on the substrate by measuring the shift in the projected image. In this exposure apparatus, relative distances between a focus test mask having the above described structure and the image of the line pattern that is formed on the substrate as well as the image of the reference patterns are measured.

According to the present invention, it is possible to provide a focus test mask that enables a pattern to be exposed under the same conditions as the actual exposure conditions and that has a test pattern that can be measured by an alignment microscope that is provided inside the exposure apparatus, and to provide a measurement method and an exposure apparatus that use this focus test mask.

What is claimed is:

1. A focus test mask that is provided with a test pattern that is projected via a projection optical system, wherein
the test pattern comprises:
a plurality of line patterns that are lined up in a direction of measurement;
phase shift sections that are used to shift the phase of light passing through, each of the phase shift sections being provided in an area adjacent to one of the plurality of line patterns forming a line-phase shift section pattern;

reference patterns that are used to obtain a reference image that forms a reference when a shift in a line pattern image is measured, and wherein a plurality of groups of contiguous pairs of adjacent line-phase shift section patterns having a same line pattern-phase shift section configuration, line-phase shift section patterns in each pair of a group being separated by a first space and adjacent pairs in the group being separated by a second space, the first and second spaces being different.

2. The focus test mask according to claim 1, wherein the plurality of line patterns in a group are all equally spaced.

3. The focus test mask according to claim 1, wherein, the plurality of line patterns include pair line patterns which are formed by two line patterns positioned apart at a space d2, and the pair line patterns are positioned apart at a space d3 that is larger than the space d2.

4. The focus test mask according to claim 1, wherein space between the line patterns is set to be 10 times or more larger than a width of the line patterns.

5. The focus test mask according to claim 1, wherein a space between the line patterns is large enough to allow secondary or greater diffracted light from the line patterns to also be used for image formation via the projection optical system.

6. The focus test mask according to claim 1, wherein there are provided a plurality of types of test patterns, and line widths of line patterns forming the test patterns are different for each type of test pattern.

7. A focus measurement method in which a pattern on a focus test mask is projected via a projection optical system of an exposure apparatus, and a focus position of the projection optical system is measured by measuring a shift in the projected image, comprising:

preparing the focus test mask according to claim 1; and measuring a relative distance between an image of the projected line pattern and an image of the reference patterns is measured.

8. The focus measurement method according to claim 7, further comprising exposing a projected image of the focus test mask onto a substrate prior to the measuring step, wherein a relative distance between an image of a line pattern that is formed on the substrate and an image of a reference pattern is measured, in the measuring step.

9. The focus measurement method according to claim 8, wherein the image of the line pattern that is formed on the substrate is picked up using an image pickup element that is provided inside the exposure apparatus, and then the image picked up by the image pickup element is processed, in the measuring step.

10. An exposure apparatus that projects a pattern provided on a focus test mask via a projection optical system, and measures a focus position of the projection optical system by measuring a shift in the projected image, comprising:

a measuring device that detects an image of the focus test mask according to claim 1, and measures a relative distance between an image of a line pattern and an image of reference patterns.

11. The exposure apparatus according to claim 10, wherein the focus test mask is a reference plate that is provided at a different position from a holding section on a mask stage that holds a mask on which a circuit pattern is formed.

12. The exposure apparatus according to claim 10, wherein the measuring device detects an image of the pattern that is projected onto substrate via the projection optical system.

13. The exposure apparatus according to claim 10, wherein the measuring device detects a spatial image of the pattern that has been projected via the projection optical system.

14. A focus test mask that is provided with a test pattern that is projected via a projection optical system, wherein the test pattern comprises:

a plurality of line patterns that are lined up in a direction of measurement;

first phase shift sections that are used to shift the phase of light passing through each of the first phase shift sections being provided in an area adjacent to one side of one of the line patterns forming a line-phase shift section pattern; and a plurality of reference patterns that are lined up in the direction of measurement and that are used to obtain a reference image that forms a reference when a shift in a line pattern image is measured, and wherein a plurality of groups of contiguous pairs of adjacent line-phase shift section patterns having a same line pattern-phase shift section configuration, line-phase shift section patterns in each pair of a group being separated by a first space and adjacent pairs in the group being separated by a second space, the first and second spaces being different, and spaces between the plurality of reference patterns are set at a size that allows each reference pattern to be regarded as equivalent to being isolated lines.

15. The focus test mask according to claim 14, wherein the test pattern further comprises second phase shift sections each of which is provided in a vicinity of one side of a reference pattern along the reference pattern and that is used to shift a phase of light passing through, and wherein a position of the first phase shift sections relative to respective ones of the line patterns is reverse to a position of the second phase shift sections relative to the reference patterns.

16. The focus test mask according to claim 15, wherein the plurality of the reference patterns are disposed on both sides of the plurality of the line patterns in the direction of measurement of the plurality of line patterns.

17. The focus test mask according to claim 15, wherein the plurality of line patterns include pair line patterns, which are formed by two line patterns positioned apart at a space d2 that is set at a size that allows each line pattern to be regarded as equivalent to being isolated lines, and which are positioned apart at a space d3 that is larger than the space d2, and wherein the plurality of reference patterns include pair reference patterns, which are formed by two reference patterns positioned apart at the space d2, and which are positioned apart at the space d3.

18. The focus test mask according to claim 17, wherein the plurality of the reference patterns are disposed on both sides of the plurality of the line patterns in the direction of measurement of the plurality of line patterns.

19. The focus test mask according to claim 17, wherein the space d3 is set to be 2 times or more larger than the space d2.

20. The focus test mask according to claim 15, wherein space between the line patterns is set to be 10 times or more larger than a width of the line patterns.

21. The focus test mask according to claim 14, wherein the plurality of the reference patterns are disposed on both sides of the plurality of the line patterns in the direction of measurement of the plurality of line patterns.

22. The focus test mask according to claim 14, wherein the plurality of line patterns of pairs of include pair line patterns, which are formed by two line patterns positioned apart at a space d2 that is set at a size that allows each line pattern to be regarded as equivalent to being isolated lines, and the pair line patterns are positioned apart at a space d3 that is larger than the space d2, and wherein the plurality of reference patterns include pair reference patterns, which are formed by two reference patterns positioned apart at the space d2, and the pair reference patterns are positioned apart at the space d3.

23. The focus test mask according to claim 22, wherein the plurality of the reference patterns are disposed on both sides of the plurality of the line patterns in the direction of measurement of the plurality of line patterns.

24. The focus test mask according to claim 22, wherein the space d3 is set to be 2 times or more larger than the space d2.

25. The focus test mask according to claim 14, wherein space between the line patterns is set to be 10 times or more larger than width of the line patterns.

26. A focus measurement method in which reference patterns, line patterns, and phase shift sections are formed on a mask, the phase shift sections being used to shift the phase of light passing through the mask, each of the phase shift sections being provided adjacent to one of the line patterns forming a line-phase shift section pattern, line-phase shift section patterns being grouped to form contiguous pairs of adjacent line-phase shift section patterns having a same line-phase shift section pattern configuration, line-phase shift section patterns in each pair of a group being separated by a first space and adjacent pairs in the group being separated by a second space, the first and second spaces being different, the reference pattern, line patterns and phase shift sections are projected via a projection optical system of an exposure apparatus, and a focus position of the projection optical system is measured by measuring a relative shift between an image of the line patterns and an image of the reference patterns, comprising:

detecting each position of images of the line patterns that are formed so as to regard each line pattern as equivalent to being isolated lines and that shift in a same direction with respect to images of the reference patterns;

calculating a position of a set of the images of the line patterns based on a result of the detecting of each position of the images of the line patterns;

detecting each position of the images of the reference patterns that are formed so as to regard each reference patterns as equivalent to being isolated lines;

calculating a position of a set of the images of the reference patterns based on a result of the detecting of each position of the images of the reference patterns;

calculating a relative shift based on the position of the set of the images of the line patterns and the position of the set of the images of the reference patterns; and calculating the focus position.

27. The focus measurement method according to claim 26, wherein each space between the plurality of the line patterns is set to be 10 times or more larger than a width of the line patterns.

28. The focus measurement method according to claim 26, wherein the images of the line patterns and the images of the reference patterns are formed on a substrate by projection exposure using the projection optical system.

29. The focus measurement method according to claim 28, wherein the step of calculating the position of the set of the images of the line patterns and the position of the set of the images of the reference patterns, comprises:

capturing images that are formed on the substrate;

detecting a position of the images by processing captured signals that are obtained by capturing the images at every image of the line patterns and the reference patterns; and calculating the position of the set of the images of the line patterns and the position of the set of the images of the reference patterns based on each position of the images.

* * * * *